United States Patent
Ballandras et al.

(10) Patent No.: US 8,829,764 B2
(45) Date of Patent: Sep. 9, 2014

(54) HBAR RESONATOR WITH HIGH TEMPERATURE STABILITY

(75) Inventors: Sylvain Ballandras, Besancon (FR); Dorian Gachon, Besancon (FR)

(73) Assignees: Universite de Franche Comte, Besancon (FR); Centre National de la Recherche Scientifique (C.N.R.S.), Paris (FR)

( * ) Notice: Subject to any disclaimer, the term of this patent is extended or adjusted under 35 U.S.C. 154(b) by 858 days.

(21) Appl. No.: 12/995,805

(22) PCT Filed: May 29, 2009

(86) PCT No.: PCT/FR2009/051011
§ 371 (c)(1),
(2), (4) Date: Aug. 3, 2011

(87) PCT Pub. No.: WO2009/156658
PCT Pub. Date: Dec. 30, 2009

(65) Prior Publication Data
US 2011/0279187 A1    Nov. 17, 2011

(30) Foreign Application Priority Data
Jun. 4, 2008  (FR) ..................... 08 53689

(51) Int. Cl.
*H03H 9/15* (2006.01)

(52) U.S. Cl.
USPC .......................... 310/320; 310/357

(58) Field of Classification Search
CPC ..... H01L 41/22; H01L 41/45; H01L 41/0926; H03H 9/177; H03H 9/0207
USPC ................................ 310/320, 357
See application file for complete search history.

(56) References Cited

U.S. PATENT DOCUMENTS

| | | | | |
|---|---|---|---|---|
| 3,401,275 | A * | 9/1968 | Berlincourt et al. | 310/320 |
| 7,609,132 | B2 * | 10/2009 | Ballandras et al. | 333/187 |
| 2004/0129958 | A1 * | 7/2004 | Koh et al. | 257/275 |
| 2004/0159153 | A1 * | 8/2004 | Dilz, Jr. | 73/489 |
| 2006/0186759 | A1 * | 8/2006 | Kim et al. | 310/320 |
| 2007/0035207 | A1 * | 2/2007 | Kawamura et al. | 310/324 |
| 2007/0040473 | A1 * | 2/2007 | Ballandras et al. | 310/320 |

OTHER PUBLICATIONS

McAvoy et al., "Highly Stable Ovenized Bulk Shear Mode Resonators," Proceedings of the Annual Frequency Control Symposium, IEEE, SYMP, 39: pp. 372-374 (1985).
Kline et al., "Overmoded High Q Resonators for Microwave Oscillators," Frequency Control Symposium, IEEE, pp. 718-721 (1993).
International Search Report and The Written Opinion from Corresponding PCT Application No. PCT/FR2009/051011.

* cited by examiner

*Primary Examiner* — Thomas Dougherty
*Assistant Examiner* — Bryan Gordon

(57) ABSTRACT

The invention relates to a resonator of the harmonic bulk acoustic resonator HBAR type, comprising a piezoelectric transducer (6) clamped between two electrodes (4, 8) with a strong electroacoustic coupling, cut according to a first cutting angle $\Theta 1$, and an acoustic substrate (10) with a working frequency acoustic quality coefficient at least equal to $5 \cdot 10^{12}$, cut according to a second cutting angle $\Theta 2$ with at least one shearing vibration mode. The transducer and the substrate are arranged in such a way that the polarization direction of the shearing mode of the transducer and the polarization direction of the shearing of the substrate are aligned, and the second cutting angle $\Theta 2$ is such that the temperature coefficient of the frequency of the first order CTFB1 corresponding to the shearing mode and to the second cutting angle $\Theta 2$ is zero with inversion of the sign thereof on either side of, or equal to, a bias.

16 Claims, 8 Drawing Sheets

HBAR RESONATOR WITH HIGH TEMPERATURE STABILITY

RELATED APPLICATIONS

This application is the U.S. National Stage of International Application No. PCT/FR2009/051011, filed May 29, 2009, which claims the benefit of French Application Serial No. 0853689, filed Jun. 4, 2008.

The invention concerns a resonator of the high bulk acoustic resonator (HBAR) type that having high temperature stability, a corresponding production method, an oscillator and a filter including at least one such resonator.

Such electro-acoustic resonators are used for the temperature stabilization of electric oscillators, as well as for a number of signal processing applications (high selectivity filtering, narrow band detection, encoding, etc.) with a base of passive components in the frequency range from 50 MHz to 20 GHz.

These devices are optimized for their particular applications while seeking to maximize their quality or coupling coefficients, for example.

It is generally difficult to find structures offering a good compromise between strong electro-mechanical coupling, high quality coefficient and thermal stability.

Numerous solutions based on surface acoustic waves (SAW) for applications to frequencies of up to 2.5 GHz make it possible to minimize the thermal drift of the frequency of the resonators, but rarely cancel it out completely.

Concerning bulk waves, the use of quartz as a piezoelectric transducer having a high frequency stability is known, but remains limited to frequencies below 100 MHz.

Concerning bulk waves, the use of a layer of nitrided aluminum (AlN) as transducer has made it possible to develop resonators in the range from 50 MHz-20 GHz. Thus, the document entitled "Thin Film Resonators and Filters" by M. Lakin published in "1999 IEEE Ultrasonics Symposium" describes a piezoelectric transducer in the form of a thin layer of aluminum nitride deposited by cathode sputtering on a substrate in the form of a silicon or gallium arsenide slice with interposition either of an air membrane, or of layers of quarter-wave materials, in order to acoustically insulate the transducer from the wafer substrate.

The document also describes the possibility of coupling a layer of silicon (SiO2) to the piezoelectric transducer via longitudinal vibration modes so as to stabilize its temperature frequency drift.

However, due to the average acoustic quality of the assembly formed by the piezoelectric transducer and the layer of silicon, the problem of the presence of a thermal drift of the frequency remains and the proposed solution is not convincing as to the compensation for the second-order thermal effects.

The document entitled "High Overtone Bulk Acoustic Resonators built using Aluminium Nitride Thin films deposited onto AT-cut quartz plates" by S. Ballandras et al. published in 2006 IEEE Frequency Control Symposium, describes a layer of nitrided aluminum embedded between two electrodes and adhered by one of the electrodes to a traditional quartz substrate. The document indicates that the mode coupled by piezoelectric effect in the aluminum nitride is longitudinal and consequently, the propagation mode in the underlying quartz has the same polarization.

Due to the poor temperature stability quality of the longitudinal waves in the quartz, the temperature stability of the frequencies is of poor quality, the linear drift exceeding 20 ppm in absolute value at ambient temperature. The problem of the presence of a thermal drift of the frequency therefore remains and does not allow this type of solution, although benefitting from a particularly high functional frequency acoustic quality (FQ) coefficient product (FQ of more than $1.3 \cdot 10^{13}$ at more than 400 MHz), to supplant body wave resonators for onboard frequency synthesis applications, for example.

The invention aims to improve the frequency thermal stability of an acoustoelectric resonator with strong piezoelectric coupling and a high functional frequency acoustic quality coefficient product.

To that end, the invention concerns a resonator of the high bulk acoustic resonator (HBAR) type, for operating at a predetermined working frequency, comprising:

a piezoelectric transducer formed by a layer with a first thickness of a first material oriented along an angle $\phi$ defined by the nomenclature (YXw)/$\phi$ of the IEEE Std-176 (1949 revision) standard equal to zero, cut along a first cutting angle $\theta1$ defined by the nomenclature (YXl)/$\theta$ of the IEEE Std-176 (1949 revision) standard, such that the electroacoustic coupling of the shear waves for that material alone is greater than 5%, the transducer having a temperature coefficient of the first-order frequency CTFA as a function of the first cutting angle $\theta1$, an acoustic substrate formed by a second layer with a second thickness of a second material having a functional frequency acoustic quality coefficient product at least equal to $5 \cdot 10^{12}$, oriented along an angle $\phi$ defined by the nomenclature (YXw)/$\phi$ of the IEEE Std-176 (1949 revision) standard equal to zero, cut along a second cutting angle $\theta2$ defined by the nomenclature (YXl)/$\theta$ of the IEEE Std-176 (1949 revision) standard, having at least one polarization direction $\vec{P}_{B1}$ corresponding to a shearing mode of vibration, the acoustic substrate having a temperature coefficient of the frequency of the first order corresponding to the at least one shearing mode and depending on the second cutting angle $\theta2$, a counter-electrode formed by a layer of metal adhering to a first face of the transducer and a face of the acoustic substrate, and an upper electrode arranged on a second face of the transducer facing away from the first face of the transducer and the substrate, characterized in that the relative arrangement of the transducer and the substrate is such that the direction of polarization $\vec{P}_A$ of the shearing mode of the transducer corresponding to the first cutting angle $\theta1$ and the polarization direction $\vec{P}_{B1}$ of the at least one shearing mode of the substrate corresponding to the second cutting angle $\theta2$ are aligned, and the second cutting angle $\theta2$ of the substrate is such that the temperature coefficient of the frequency of the first order CTFB1 corresponding to the at least one shearing mode and to the second cutting angle $\theta2$ is zero with inversion of its sign on either side or equal to the opposite of the frequency temperature coefficient CTFA of the transducer weighted by an increasing function of the ratio of the second thickness over the first thickness when the ratio is greater than or equal to 0.02.

According to specific embodiments, the HBAR resonator includes one or several of the following features:

the temperature coefficient of the frequency of the second order corresponding to the second cutting angle $\theta2$ for which the temperature coefficient of the of the frequency of the first order CTFB1 cancels itself out by changing signs is also zero;

when the ratio Re of the second thickness over the first thickness is greater than or equal to 0.02, the second cutting angle θ2 verifies a relationship of form:

α·Re+β·log(γ·Re)=(θ2−θ2nul)*slope,

θ2nul being a second cutting angle value for which the temperature coefficient of the frequency of the first order CTFB1 cancels itself out by changing signs,
slope being the slope of CTFB1 relative to θ2 taken in θ2nul,
α, β and γ are constants depending on the materials making up the acoustic substrate and the transducer;
the material of the transducer is included in the group of materials made up of aluminum nitride (AlN), zinc oxide (ZnO), lithium niobate (LiNbO$_3$), lithium tantalate (LiTaO$_3$) and potassium niobate;
the material of the transducer is preferably included in the group of materials made up of lithium niobate (LiNbO$_3$) and lithium tantalate (LiTaO$_3$);
the material of the acoustic substrate is included in the group of materials made up of quartz, potassium niobate, gallium orthophosphate (GaPO$_4$), lithium tetraborate (LiB$_4$O$_7$), langasite (La$_3$Ga$_5$SiO$_{14}$), langatate and langanite;
the material of the acoustic substrate is quartz;
the counter-electrode is a thermo-compressible metal;
the counter-electrode is made up of gold or copper or indium;
the geometric dimensions of the resonator are adapted for a resonance frequency of a frequency band included in the frequency range from 50 MHz to 20 GHz;
the acoustic substrate has a direction of polarization for which the temperature coefficient of the frequency CTFB1 cancels itself out with sign inversion on either side in two values θ2null and θ2nul2, the first value θ2null being associated with a slow shearing mode of vibration and the second value θ2nul2 being associated with a fast shearing mode of vibration;
the material of the acoustic substrate is quartz; and
the material of the transducer is lithium niobate and in that:
when θ2nul is equal to +35 degrees,
α is equal to 0.85,
β is equal to 3.2
γ is equal to 200,
and slope is equal to 5·10$^{-6}$,
when θ2nul is equal to −42 degrees,
α is equal to 1.25×50
β is equal to 3.2
γ is equal to 200,
and slope is equal to 2.2·10$^{-6}$.

The invention also concerns a method for manufacturing a HBAR resonator comprising the following steps:
in a first step, providing a piezoelectric transducer made up of a layer of a first thickness of a first material oriented along an angle φ defined by the nomenclature (YXw)/φ of the IEEE Std-176 (1949 revision) standard equal to zero and cut along a first cutting angle θ1 defined by the nomenclature (YXl)/θ of the IEEE Std-176 (1949 revision) standard, such that the electroacoustic coupling of the shear waves is greater than 5%, the transducer having a temperature coefficient of the frequency CTFA as a function of the first cutting angle θ1,
in a second step, providing an acoustic substrate formed by a first layer with a second thickness of a second material having a functional frequency acoustic quality coefficient product at least equal to 5·10$^{12}$, oriented along an angle φ defined by the nomenclature (YXw)/φ of the IEEE Std-176 (1949 revision) standard equal to zero, cut along a second cutting angle θ2 defined by the nomenclature (YXl)/θ of the IEEE Std-176 (1949 revision) standard, having at least one polarization direction $\vec{P}_{B1}$ corresponding to a shearing mode of vibration, the acoustic substrate having a temperature coefficient of the frequency of the first order corresponding to the at least one shearing mode and depending on the second cutting angle θ2, the second cutting angle θ2 of the acoustic substrate being such that the temperature coefficient of the frequency of the first order CTFB1 corresponding to the at least one shearing mode and to the second cutting angle θ2 is zero with inversion of its sign on either side or equal to the opposite of the frequency temperature coefficient CTFA of the transducer weighted by an increasing function of the ratio of the second thickness over the first thickness when the ratio is greater than or equal to 0.02, and in an assembly step, arranging the transducer and the acoustic substrate such that the polarization direction $\vec{P}_A$ of the shearing mode of the transducer corresponding to the first cutting angle θ1 and the polarization direction $\vec{P}_{B1}$ of the at least one shearing mode of the substrate corresponding to the second cutting angle θ2 are aligned.

The invention also relates to a homodyne oscillator comprising a HBAR resonator as defined above.

The invention also relates to a high reject filter comprising HBAR resonator-based cells as defined above.

The invention will be better understood upon reading the following description of one embodiment, provided solely as an example and done in reference to the drawings, in which:

FIG. 1 is a perspective view of a HBAR resonator according to the invention,

FIG. 2 is a transverse cross-sectional view of the resonator of FIG. 2 along line II-II, FIG. 3 is a view of the illustration of the first cutting angle θ1 of the crystal forming the piezoelectric transducer, FIG. 4 is a view of the evolution of the phase velocity of the bulk waves of a lithium niobate crystal as a function of the cutting angle θ1, this family of crystalline orientations generally being called "single rotation cuts,"

FIG. 5 is a view of the evolution of the coupling coefficients of these same waves for the lithium niobate as a function of the angle θ1, FIG. 6 is a planar illustration related to the plate of the transducer of the polarization of the shear waves of the transducer, FIG. 7 is a view of the illustration of the second cutting angle θ2 of the crystal forming the acoustic substrate, FIG. 8 is a planar illustration related to the plate of the acoustic substrate of the polarization of the shear waves of the acoustic substrate, FIG. 9 is a variation graph of the temperature coefficients of the frequency of the first order with constant polarization for the shearing modes of the quartz as a function of the cutting angle θ2.

Figure 1:
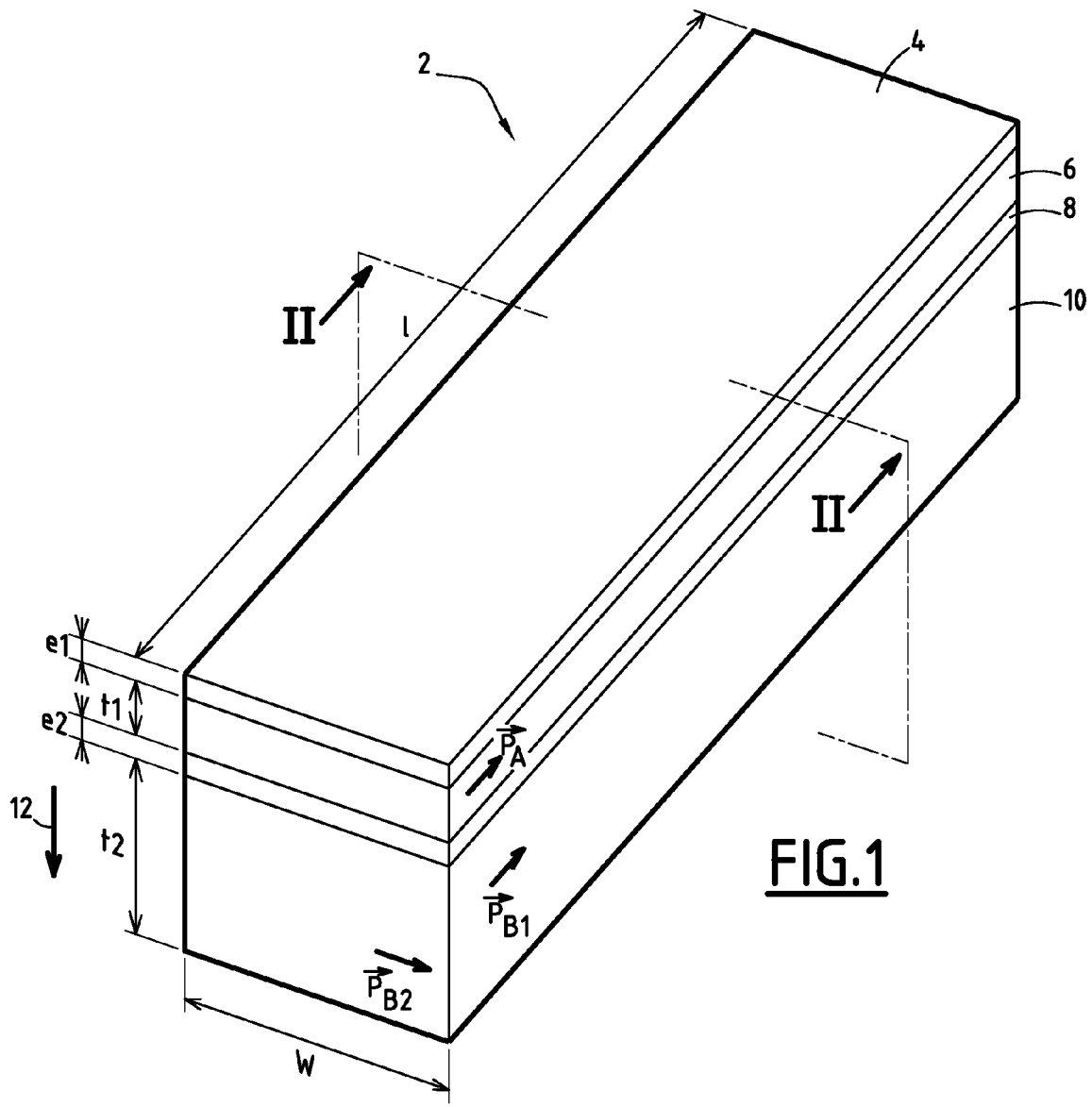
FIGS. 1 and 2 illustrate an embodiment of a high bulk acoustic resonator 2 according to the invention.

The resonator 2 comprises a stack of successive layers including:
- an upper electrode 4 made of aluminum with a thickness $e_1$,
- a piezoelectric transducer 6 made up of a first material, here lithium niobate (LiNbO3), in monocrystalline form having a first thickness $t_1$,
- an embedded counter-electrode 8, made of gold, with a thickness $e_2$,
- an acoustic substrate 10 made up of a second material, here quartz, in monocrystalline form having a second thickness $t_2$.

All of the layers 4, 6, 8 and 10 in FIG. 1 have the same length l and width W, the length l being clearly larger than the width W and the different layer thicknesses $e_1$, $t_1$, $e_2$ and $t_2$.

To simplify FIG. 1, the electrodes 4, 8 are shown with surfaces equal to those of the piezoelectric transducer 6.

In practice, the electrodes 4, 8 have smaller surfaces than those of the piezoelectric layer 6, and the upper electrode 4 has a surface smaller than or equal to that of the embedded counter-electrode.

In the manufacturing method including a step for providing an embedded layer serving as adhesion layer, the counter-electrode 8 naturally has a larger surface than that of the upper electrode 4 manufactured by a lithography and metal layer deposition technique.

The surfaces of the electrodes 4, 8 are positioned facing each other, parallel to each other, the respective zones facing the surfaces being maximal, with the edges as parallel as possible. Ideally, the surfaces of the electrodes 4, 8 are perfectly superimposed.

Figure 2:
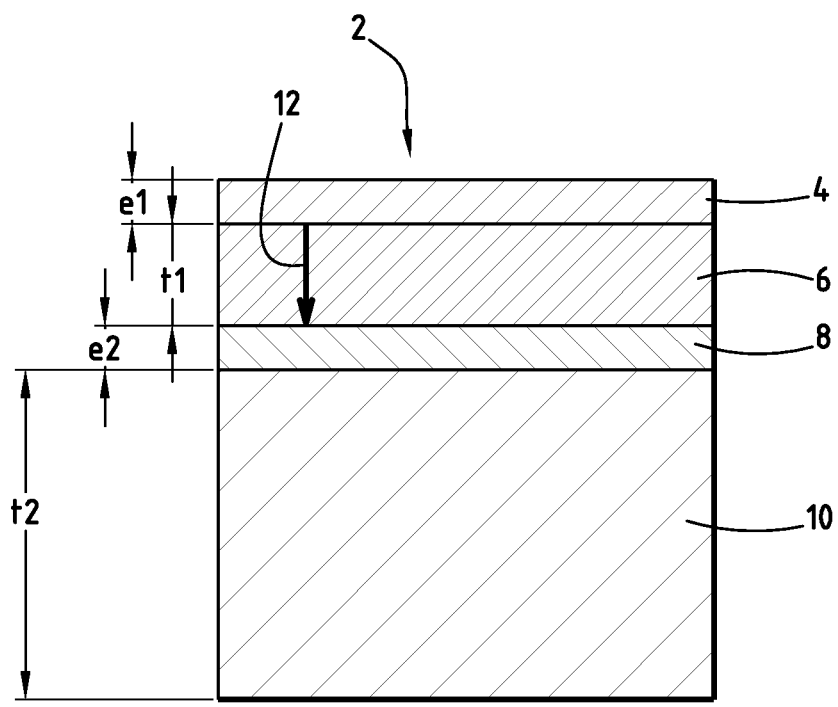

Thus, the excitation of the waves is assumed to correspond to a so-called plane-plane resonator configuration, for which the waves are excited by the very thin electrodes 4, 8 deposited on the surfaces opposite the piezoelectric transducer 6, in the direction illustrated by arrow 12 according to FIG. 2 of propagation of the shear waves in the transducer 6.

The piezoelectric transducer 6 has an excited shearing mode according to a polarization oriented along the length L of the resonator illustrated by the vector $\vec{P}_A$.

The acoustic substrate 10 has two shearing modes, a first so-called slow mode and a second so-called fast mode.

The so-called fast shear waves and the so-called slow shear waves are defined as orthogonal polarization shear waves, the so-called fast waves having a higher phase velocity than the so-called slow waves.

In FIG. 1, the polarization vector $\vec{P}_A$ of the excitation corresponding to the shearing mode of the transducer 6 is aligned with a polarization vector referenced $\vec{P}_{B1}$ corresponding to a shearing mode of the acoustic substrate.

A polarization vector corresponding to the shearing mode orthogonal to that illustrated by $\vec{P}_{B1}$ is illustrated in FIG. 1 by $\vec{P}_{B2}$, orthogonal to $\vec{P}_{B1}$ and contained in an extension plane of the substrate 10.

The counter-electrode 8 thermo-compressed between the transducer 6 and the substrate 10 is also used for adhesion to the structure of the resonator 2.

The layer of lithium niobate (LiNbO3) making up the transducer 6 is a plate cut out along a first cutting angle θ1 in a raw monocrystalline material forming a wafer.

The layer of quartz making up the acoustic substrate 10 is a plate cut out along a second cutting angle θ2 in a raw monocrystalline quartz wafer.

Figure 3:
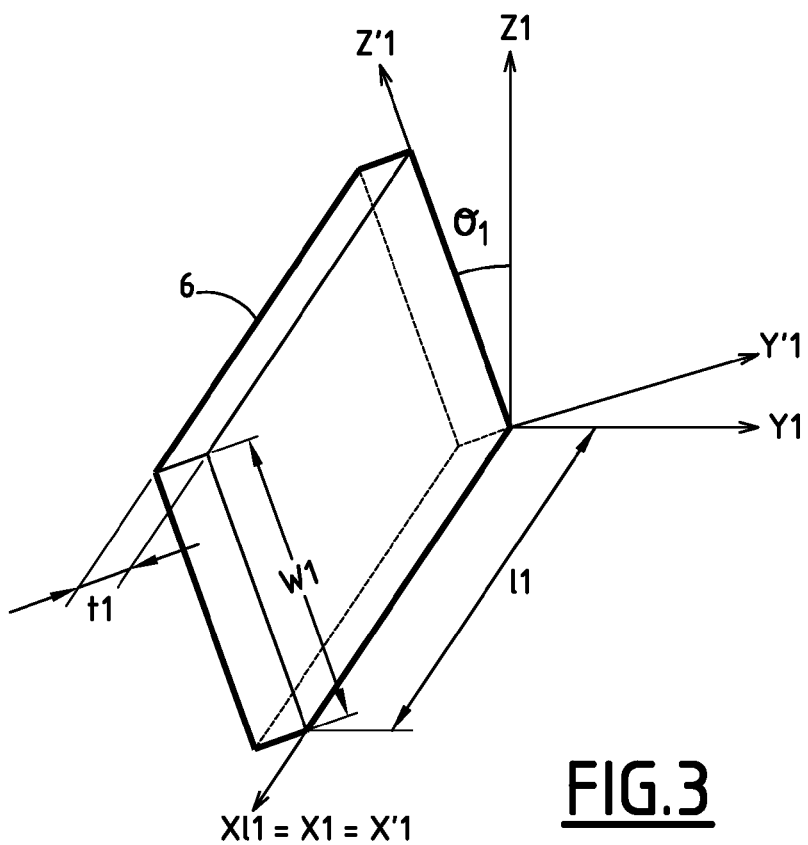

According to FIG. 3, the lithium niobate plate 6 is cut out along a first cutting angle θ1 from the material of the wafer not illustrated but referenced by its crystallographic axes $X_1$, $Y_1$, $Z_1$, axis $Z_1$ being the longitudinal axis of the wafer and the crystallographic axes $X_1$, $Y_1$ being predetermined during manufacture of the monocrystal.

The angle θ1 here is defined in the IEEE Std-176 (1949 revision) standard as the angle θ1 of a single rotation cutting around the crystallographic axis X1, the cut being noted ($Y_1$ $X_{l1}$)/θ1 in the IEEE standard, $X_{l1}$ being the axis aligned on the straight lower edge with thickness $t_1$ with length $l_1$ according to the illustration of FIG. 3.

The reference related to the cut out plate 6 is shown by the three axes $X'_1$, $Y'_1$, $Z'_1$, the axis $X'_1$ being combined with the axis X1. The two axes $Y'_1$, $Z'_1$, are obtained by rotating the axes $X_1$, $Y_1$, respectively, around the axis X1 by an angle of rotation θ1.

Figure 4:
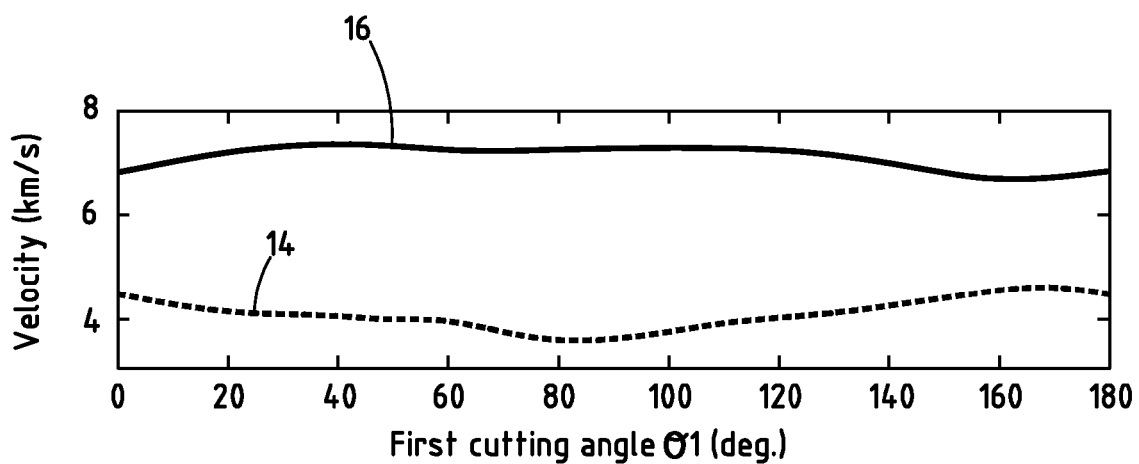

FIG. 4 shows the evolution of the phase velocity of the longitudinal and shear waves for single rotation cuts around the crystallographic axis $X_{l1}$ of the transducer 6 for lithium niobate.

Curve 14 shows the phase velocity of the shear waves propagating within the transducer 6 along the normal axis at the planes of the electrodes 4 and 8, as a function of the first angle θ1.

The curve 16 represents the phase velocity of the longitudinal waves, expressed in km/s, spreading in the transducer 6 along the axis of the length l as a function of the first cutting angle θ1, expressed in degrees.

Figure 5:
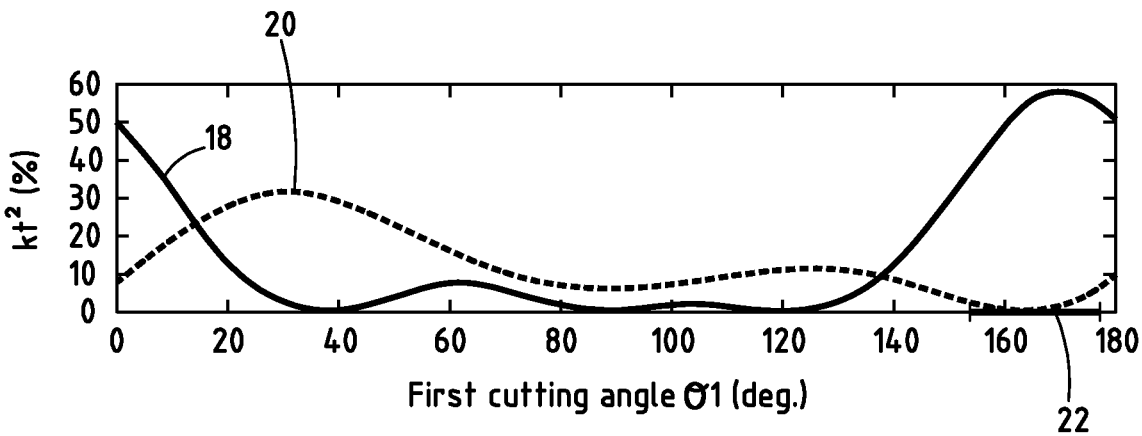

FIG. 5 shows the coupling of the longitudinal and shear waves for single rotation cuts around the crystallographic axis $X_1$ of the transducer 6.

Curve 18 shows the evolution of the coupling coefficient $K^2_T$ expressed as a percentage of electrical energy converted into acoustic energy for shear waves as a function of the first cutting angle θ1 expressed in degrees.

Curve 20 shows the evolution of the coupling coefficient $K^2_T$ expressed as a percentage of electrical energy converted into acoustic energy for longitudinal waves as a function of the first cutting angle θ1 expressed in degrees.

FIG. 5 shows that curves 18 and 20 have an angular zone 22 in which the longitudinal wave is practically not coupled by piezoelectricity and therefore does not contribute to the electric response of the transducer 6 and the excitation of the shear wave is particularly effective, with an electromechanical coupling between 50 and 60%.

The angular zone 22 is centered around the angle θ1 equal to 163° and with an amplitude equal to 10°.

Figure 6:
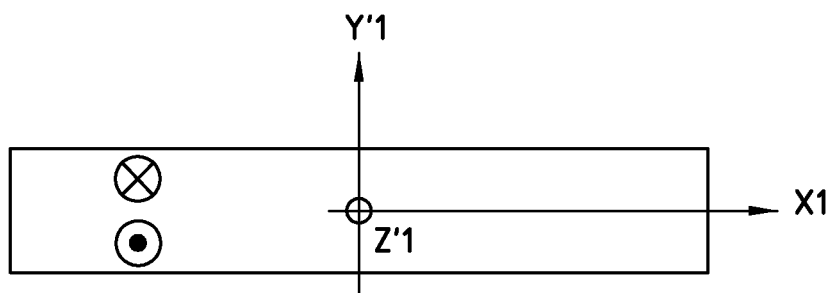

The cutting angle θ1 of the transducer described in FIG. 1 is chosen in zone 22 of FIG. 6 equal to 163°.

For simple rotation cuts of lithium niobate, only the mode corresponding to the fast shear wave has electromechanical coupling by piezoelectricity. Considering the planar illustration provided in FIG. 6 of the plate of the transducer 6 along the planar axes $X'_1$, $Y'_1$, it is shown that the shearing mode excited by piezoelectricity has a scalar polarization along the axis $Z'_1$ shown from the end in FIG. 6, i.e. normal to the plane $(X'_1, Y'_1)$, but whereof the spatial dependence is described by a function of the spatial coordinates according to the excitation plane. The polarization vector $\vec{P}_A$ is chosen collinear to the axis $Z'_1$.

Figure 7:
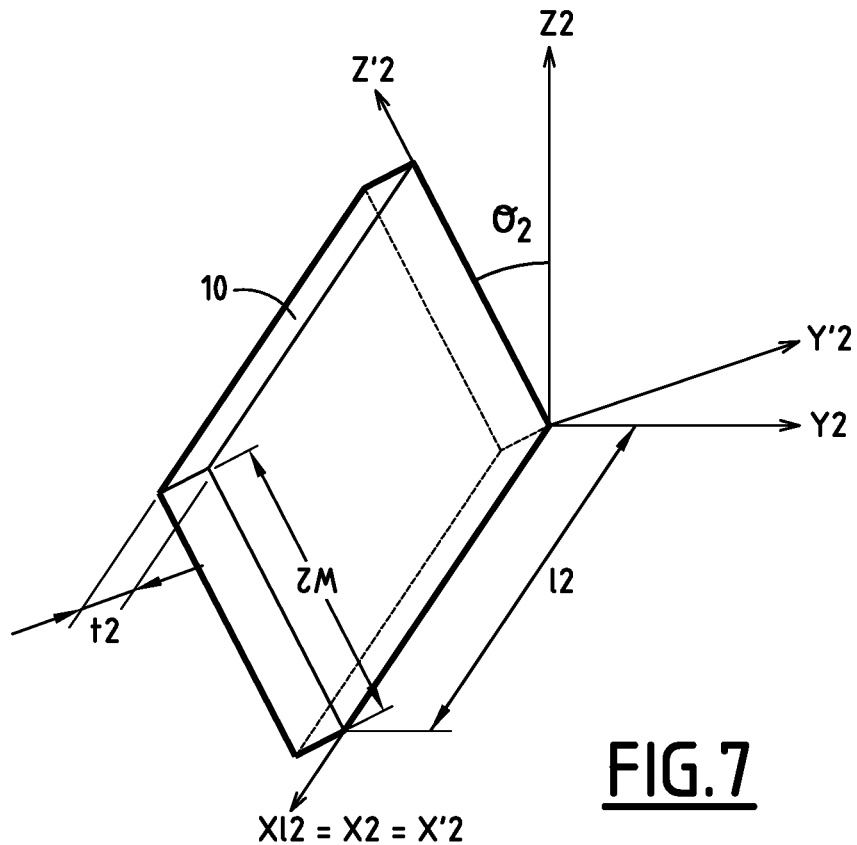

According to FIG. 7, the quartz plate 10 is cut out according to a second angle θ2 from the raw monocrystal of the wafer not illustrated but referenced by the crystallographic axes of the quartz $X_2$, $Y_2$, $Z_2$, the axis $Z_2$ being the optical axis C revealed during the growth of a crystal gem.

The angle θ2 here is that defined in the IEEE Std-176 (1949 revision) standard as the angle θ2 of a single rotation cut around the crystallographic axis $X_2$, the cut being noted ($Y_2$, $X_{/2})/θ2$ in the IEEE Std-176 standard, $X_{/2}$ being the axis aligned on the straight lower edge with thickness $t_2$ with length $L_2$ according to the illustration of FIG. 4.

The reference related to the cut out quartz plate 10 is illustrated by the three axes $X'_2, Y'_2, Z'_2$, the axis $X'_2$ being coincident with the axis $X_2$. The two axes $Y'_2, Z'_2$ are obtained by rotating the axes $Y_2, Z_2$, respectively, around the axis $X_2$ by the angle of rotation θ2.

Figure 8:
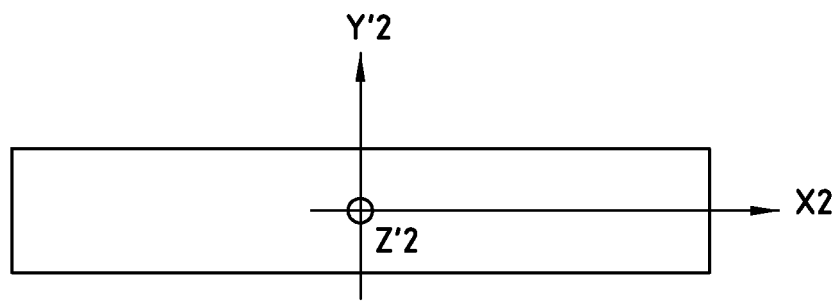

Considering the planar illustration along the planar axes $X'_2, Y'_2$ provided in FIG. 8 of the quartz plate 10, similar to the planar illustration provided for the transducer 6 in FIG. 6, it is possible to describe the polarization of the shearing mode one wishes to exploit in the quartz that has cuts for which the thermal sensitivities of the first order or even the second order cancel themselves out. The shearing in the case of quartz is also scalar, but is established along the axis $X'_2$ and depends on the local coordinates connected to the plate according to the excitation plane. For single rotation quartz and lithium niobate or tantalate plates noted (YXl/θ) according to the IEEE standard notation 176 1949 revision (IEEE Standard on piezoelectricity Std 176-1949, Proc. of the IRE, vol. 37, pages 1378-1395, 1949), the chosen shear waves therefore have polarizations that are orthogonal to each other and only couple if the alignments of the crystallographic axes of the transducer 6 and acoustic substrate are suitably chosen. These polarizations must be taken into account during assembly of the materials of the transducer and the acoustic substrate to allow coupling of the acoustic waves one wishes to excite in the acoustic propagation substrate 10, here the quartz.

Here, this acoustic coupling effect is obtained by aligning the axis $Z'_1$ of the transducer 6 on the axis $X'_2$ of the acoustic substrate 10, or equivalently by aligning the axis $X'_1$ of the transducer 6 on the axis $Z'_2$ of the acoustic substrate 10, such that the polarization $\vec{P}_A$ of the excited mode in the transducer 6 is identical to those of shearing modes in the acoustic substrate 10 illustrated by $\vec{P}_{B1}$ making it possible to offset the thermal drift of the phase velocity of the corresponding waves.

Figure 9:
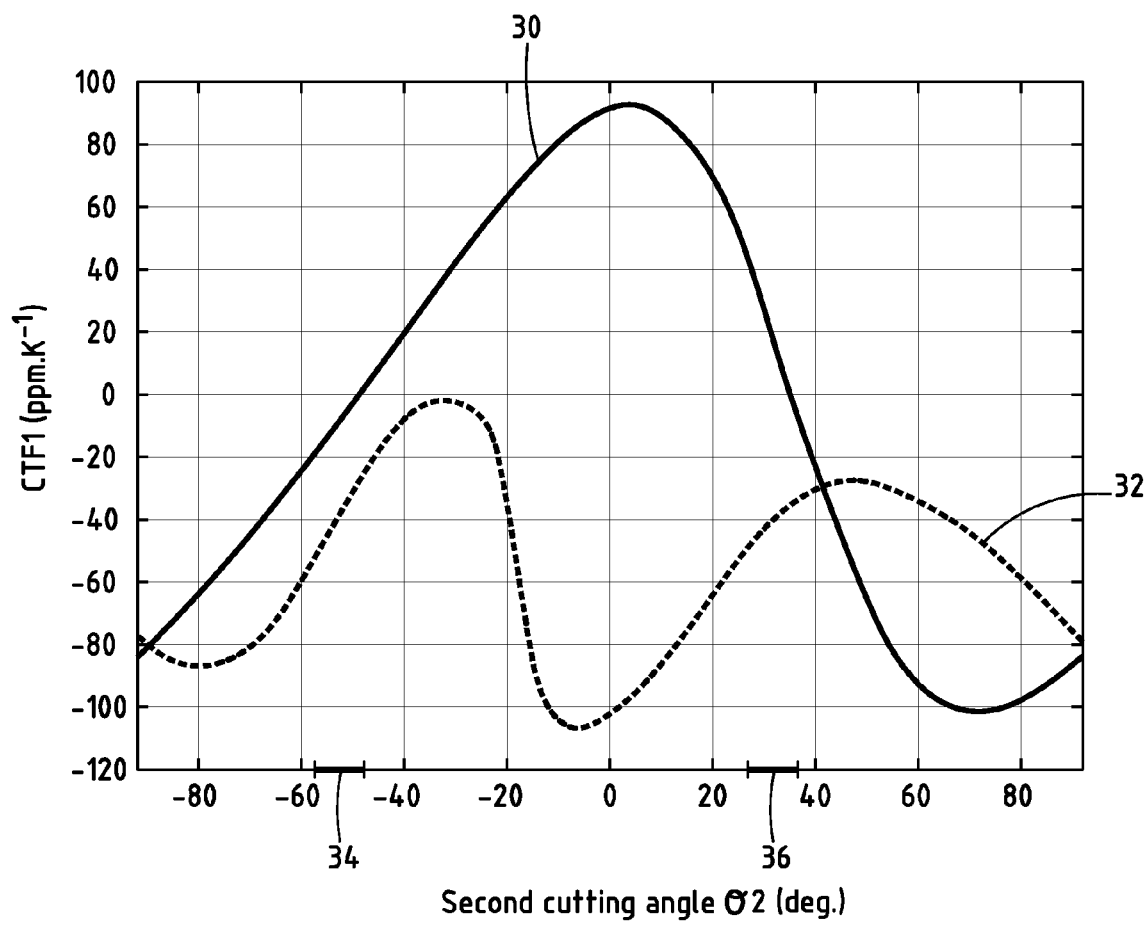

FIG. 9 illustrates the sensitivity of the shearing modes of the quartz to the static thermal effects in the form of two temperature coefficients of the frequency of the first order CTFB1 and CTFB2 corresponding to constant polarizations orthogonal to each other for a plane-plane acoustic substrate 10 similar to that of FIG. 1 expressed in ppm·$K^{-1}$ (parts per million of the frequency per Kelvin), as a function of the second cutting angle θ2 expressed in degrees.

A first curve 30 in solid lines illustrates the evolution of the first temperature coefficient of the frequency of the first order CTFB1 for the shear waves polarized along the axis $X'_2$ as a function of the second cutting angle θ2, their polarization corresponding to the vector $\vec{P}_{B1}$ in FIG. 1.

A second curve 32 in dotted lines illustrates the evolution of the temperature coefficient of the frequency of the first order CTFB2 for the shear waves polarized orthogonal to the preceding ones as a function of the second cutting angle θ2, their polarization corresponding to the vector $\vec{P}_{B2}$ in FIG. 1.

The so-called fast shear waves and the so-called slow shear waves are defined as shear waves with orthogonal polarization, the so-called fast waves having a higher phase velocity than the so-called slow waves.

In the case of quartz, in the vicinity of the cutting angle θ2 equal to −24 degrees, the slow and fast modes swap polarizations. The modes remain orthogonal, but the fast shear mode replaces the slow shear mode for cuts with angle θ2 between −24 and −90 degrees. This phenomenon is not visible in FIG. 8 because curves 30 and 32 are illustrations of constant polarization CTFBs, but not illustrations by fast or slow mode type.

For θ2 comprised between −24 degrees and +90 degrees, the polarized waves along $X_2$ correspond to the slow shear mode whereas for θ2 between −90 degrees and −24 degrees, the polarized waves along $X_2$ correspond to the fast shear mode.

Curve 30 shows the existence of two angular zones 34, 36 in each of which there is an angular valued noted θ2null1 and θ2nul2, respectively, for canceling out the temperature coefficient of the frequency of the first order CTFB1 for the shear waves polarized along axis $X'_2$.

For the zone 36, also called cut family AT, very precise cutting values θ2 can be obtained between 35 degrees and 36 degrees making it possible to cancel out the second-order temperature coefficient, the drift of the frequency as a function of the temperature then following a law of cubic evolution.

For the zone 34, only the coefficient of the first order can cancel itself out, but this traditional cut family called BT is known for having better resonance quality factors than those accessible with the cut family AT.

In the case of quartz, θ2null1 and θ2nul2 are equal to −42 degrees and +35 degrees, respectively.

The first angular zone 34 centered on θ2null1 has an amplitude of 20 degrees, preferably 10 degrees, for which the curve portion 30 can be likened to a straight segment with a positive slope.

The second angular zone 36 centered on θ2nul2 also has an amplitude of 20 degrees, preferably 10 degrees for which the curve portion 30 can be likened to a straight segment with a negative slope.

The first cutting angle θ1 of the transducer of FIG. 1 is chosen in the zone 22.

The second angle θ2 of the acoustic substrate 10 is chosen in the portion of one of the zones 34 or 36 for which CTFB1 is zero or positive taking into account the fact that the CTFA coefficient is negative.

In the case of the cut AT, i.e. θ2 in the zone 36 and preferably equal to 35 degrees, for thicknesses of lithium niobate much smaller than those of the quartz, i.e. a ratio of the niobate/quartz thicknesses of less than 2%, the first modes sufficiently coupled to be detected are completely compensated for the temperature effects by the quartz. The temperature sensitivity of the resonator noted CTFR of the first order is less than 1 ppm·$K^{-1}$ for coefficients of the second order of about 1 ppb·$K^{-2}$.

But for the modes having a maximal electromechanical coupling, an abrupt increase is observed in the absolute value of the temperature sensitivity of the first order of the resonator. This phenomenon is explained by the fact that the energy useful to excite the mode is then always greater in the layer of niobate than in the quartz until it reaches a maximum for a frequency close to the velocity of the waves coupled in the lithium niobate divided by two times the thickness of the layer of niobate, the mode corresponding to the fundamental of the layer of the transducer alone. The resulting mode in the resonator is then more sensitive to the properties of the excitation layer formed by the transducer and the electrodes than the modes whereof the energy is primarily located in the quartz. However, the temperature sensitivity of the first order of the resonator CTFR does not reach the temperature sensitivity values CTFA of the first order of the transducer alone, which makes it possible to minimize the sensitivity value of the resonator by tuning the cut of the quartz.

Considering the calculated temperature sensitivity value of the first order of the transducer 6 alone, in the vicinity of −90 ppm·K$^{-1}$ and the sensitivity value of the quartz practically at 0 ppm·K$^{-1}$, the value of the CTFR of the first order resulting from the resonator for the optimal coupling mode can be evaluated as being the weighted sum of the temperature coefficients of the frequency of the first order of the transducer and of the acoustic substrate according to the formula:

$$CTFR = CTFB1(\text{quartz}) + CTFA(\text{niobate}) * Y(\%).$$

The factor Y expressed as a percentage is equal to 6, 10, 15, respectively, for niobate/quartz thickness ratios equal to 1/50, 2.5/50 and 5/50, the thicknesses being of the order of one or several μms. To obtain compensation for the temperature effects of the most strongly coupled mode, the CTFB1 of the quartz must be more or less equal to +5, +10 and +15 ppm·K$^{-1}$, respectively.

It is shown that for niobate/quartz thickness ratios Re equal to 10/50 and 20/50, the values of Y are 22 and 32%.

The distribution of the CTFR of the mode at the highest coupling as a function of Re follows the following law:

$$CTFR = 0.85 \times Re + 3.2 \times \log(4 \times 50 \times Re), \text{ in which}$$

Re designates the ratio of the thickness of the transducer over the thickness of the acoustic substrate, and Log is the Nepierian logarithm function, the thicknesses being implicitly in μm and the CTFR being expressed in ppm·K$^{-1}$.

From the evolution of the CTFB1 of the quartz alone as a function of the cutting angle θ2 around the axis X2, which is expressed close to θ2 equal to +35 degrees (cut AT) by the formula: CTFB1=(θ2−35)*5·10$^{-6}$, and the distribution formula of the CTFT, the corrected cutting angle θ2 noted θ2cor making it possible to compensate the temperature effects of the most coupled mode, is determined by the equation 0.85× Re+3.2×log(4×50×Re)=(θ2cor−35)*5·10$^{-6}$. The cuts YXl/θ2 with an angle θ2 equal to 34, 33, and 32 are used according to this equation for respective thickness ratios 1/50, 2.5/50 and 5/50. Thus, the cutting angle θ2 is adjusted as a function of the harmonic rank of the coupling mode of the resonator and the niobate/quartz thickness ratio for a cut AT. The compensation of the temperature drift thus obtained is of the first order and the second order.

If we now replace the cut AT (θ2 equal to 35 degrees) of the quartz and its close neighbors with the cut BT (in the zone 34 near the cutting angle θ2 equal to −48 degrees), a behavior similar to that observed for the cut AT is observed.

With the first modes not very coupled, the CTFR of the resonator is completely equal to the CTFB1 of the quartz, the compensation being of the first order only in the case of the cut BT.

For the maximal coupling mode, the CTFR of the resonator is higher and closer to the CTFRs observed for the cut AT. The CTFR values of the first order of the resonator for thickness ratios Re of 1/50, 2.5/50 and 5/50 are equal to −6, −11 and −16 ppm·K$^{-1}$, respectively.

Going back to the relationship expressing the value of the CTFR of the first order resulting from the resonator for the optimal coupling mode as the weighted sum of the temperature coefficients of the frequency of the first order of the transducer and of the acoustic substrate according to the formula:

CTFR=CTFB1(quartz)+CTFA(niobate)*Y(%), we find that Y is equal to about 7, 12, and 17 for the respective thickness ratios Re 1/50, 2.5/50, and 5/50, which corresponds to a progression similar to that observed for the cut AT.

In the vicinity of the cut BT (θ2 equal to −42 degrees), the evolution of the CTFB1 of the quartz is advantageously approached by the law CTFB1=(θ2+42)*2.2·10$^{-6}$.

The corrected angle θ2 of the cuts YXl/θ2 is calculated as having to be equal to −45, −43, and −41 degrees for respective thickness ratios Re of 1/50, 2.5/50, and 5/50.

It is also shown that the distributive law of the CTF1 of the most coupled mode of the resonator as a function of the ratio of the niobate/quartz thicknesses determined in the case of the cut AT is applicable to within a constant in the case of the cut BT. The law is written: CTFR=1.25×50×Re+3.2×log(4×50× Re), which makes it possible to generalize the design procedure when it involves adjusting the niobate/quartz thickness ratio and the cutting angle θ2 of the quartz to compensate the best coupled mode of the temperature effects.

The results obtained here can be transposed regardless of the thicknesses of the layers of niobate and quartz. In particular, if the gap between resonance modes depends on the total thickness of the stack formed by the transducer and the acoustic substrate, only the ratio of the thicknesses Re determines the CTFR of the first order of the resonance modes as a function of their harmonic rank.

Thus, a temperature compensated HBAR resonator structure can be formed in which the geometric dimensions of the transducer are defined such that the resonator resonates at the desired tuning frequency.

The geometric dimensions of the transducer are defined such that the resonator resonates at a desired tuning frequency with additional electrical characteristics resulting from operating requirements of an application.

The additional electrical characteristics are for example the spectral separation between two resonance modes defined as the spectral zone around the resonance mode lacking other resonances, the efficiency of the electromechanical coupling of the selected resonance mode, the characteristic impedance of the resonance, the quality coefficient at the resonance and the thermal stability of the resonance mode.

The spectral separation makes it possible to define the total thickness of the stack of layers of the HBAR resonator since the spectral separation corresponds to the frequency of the fundamental mode of the assembly formed by the transducer and the acoustic substrate including the embedded electrode.

The thicknesses of each layer of the HBAR resonator formed by different materials are adjusted so as to obtain a mode at the desired resonance or tuning frequency.

The thickness of the piezoelectric transducer is also determined taking into account the desired electromechanical coupling. The coupling is maximum when the selected mode is close to the fundamental mode of the resonance in the piezoelectric transducer alone.

The ratio of the transducer/acoustic substrate thicknesses is adjusted as a function of the desired thermal stability and the quality coefficient of the targeted resonance, knowing that to reliably achieve the performance of the quality parameter at the resonance, it is necessary to know well the viscoelastic constants of the materials used or other physical coefficients with complex values representative of physical properties such as, for example, the dielectric constants. The imaginary parts of these constants are often determined heuristically or by adjusting parameters of predictive models.

The impedance at the resonance depends on the electromechanical coupling of the selected mode and the value of the electrode surfaces facing it. For a given impedance, for example 50 ohms, the weaker the electromagnetic coupling of the selected mode, the bigger the facing surfaces of the electrodes.

The typical electrode surfaces are between a few hundred μm$^2$ and several mm$^2$ for stacking thicknesses from a mm to several μm.

The coupling of the electroacoustic vibrations of the transducer 6 is done through the counter-electrode 8, which acts as an acoustic short circuit in the bandpass of the transducer 6.

The acoustic substrate 10 thus slaves the resonance modes of the transducer 6 to its own resonance modes and thereby grants great temperature stability to the resonance modes of the transducer 6, which, left free, would drift considerably. Indeed, the temperature coefficients of the frequency of the first order of the HBAR piezoelectric transducers have high values, for example between −80 and −95 ppm·K$^{-1}$ for lithium niobate and −35 to −50 ppm·K$^{-1}$ for lithium tantalate.

Thus, the temperature stability of the resonance modes of the transducer 6 thus slaved is that corresponding to the value of the temperature coefficient of frequency CTFB1 selected through the second cutting angle θ2 and the alignment of the polarization vectors $\vec{P}_A$, $\vec{P}_{B1}$ respectively corresponding to the shearing mode of the transducer 6 and the coupled shearing mode of the quartz 10, taking into account the adjustment laws of the cutting angle θ2, harmonic rank of the resonance mode, and thickness ratio Re of the transducer/acoustic substrate of the resonator.

Figure 10:
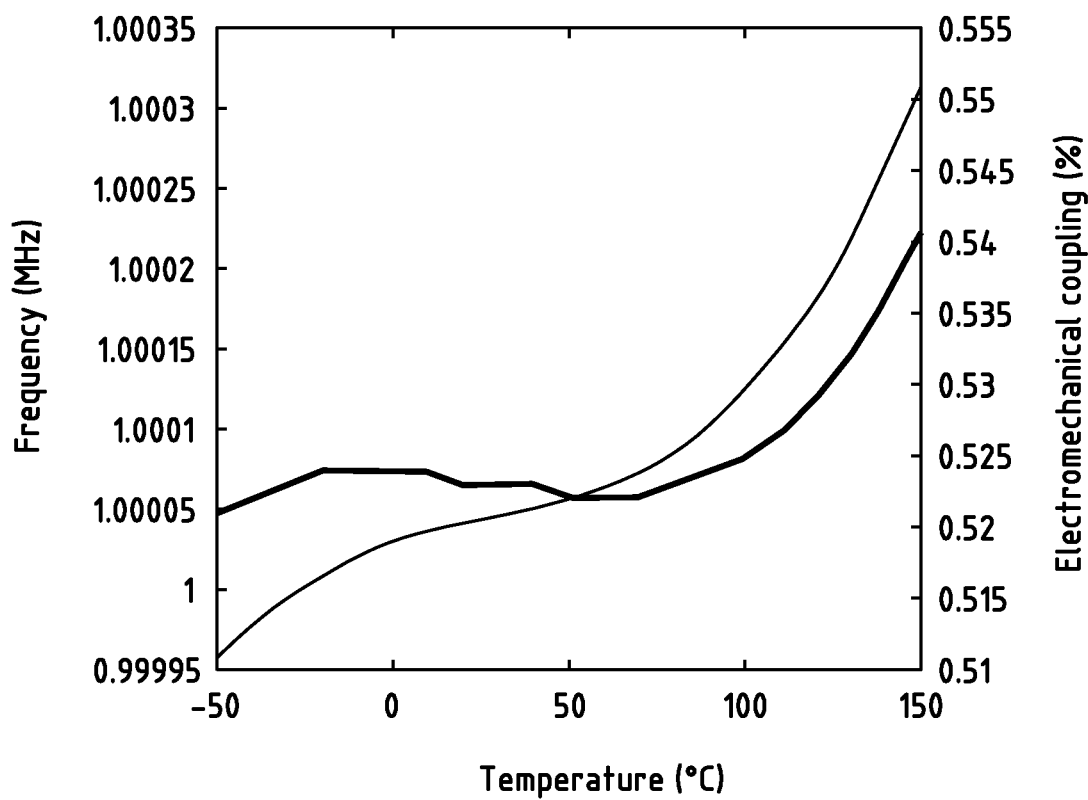
FIG. 10 is a graph of typical temperature stability performance of the frequency in the bandpass of the resonator of FIG. 1 according to the invention.

FIG. 10 shows an example of temperature stability performance of a resonator according to the invention.

It appears in FIG. 8 that the nominal operating temperature for which the frequency drift of the transducer 6 is completely compensated is equal to 50° C. Conventionally, the nominal operating temperature of spatial electronic equipment is between 20 and 60° C.

The nominal operating temperature of the resonator can be adjusted without difficulty in the temperature range from −273° C. to the Curie temperature of quartz (+575° C.).

In practice, an operational temperature range is the range from the temperature of liquid helium or liquid nitrogen (cryogenic reference) up to +400° C.

Although the integrity of the adhesion at extreme temperatures remains to be validated, the robustness of such a device has been verified at low temperatures corresponding to liquid nitrogen and up to 200° C.

The variation of the resonance frequency as well as that of the anti-resonance frequency indicative of the pass bandwidth of the resonator is less, in FIG. 8, than 1 ppm·K$^{-1}$.

Figure 11:
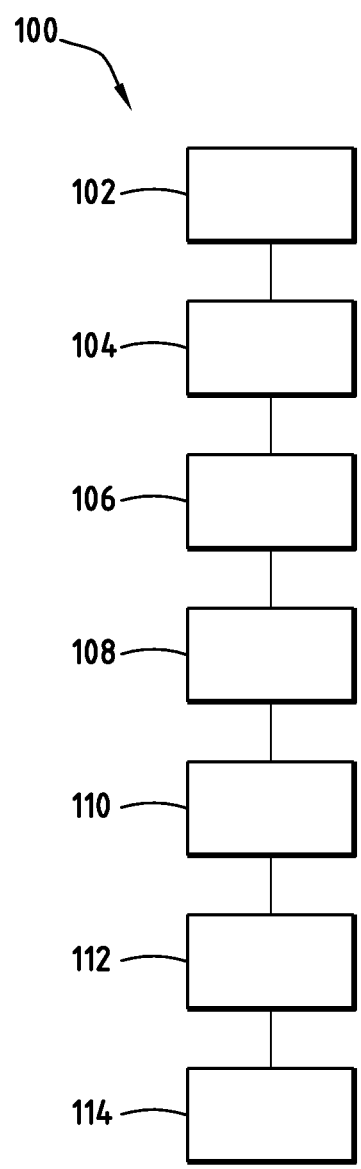
FIG. 11 is a flowchart of an embodiment of the manufacturing method of the resonator described in FIG. 2.

FIG. 11 illustrates a flowchart of a method 100 for manufacturing a resonator 2 of FIG. 1 according to the invention.

In a first step 102, a piezoelectric transducer 6 is provided formed by a layer of a first thickness of a first material oriented along an angle φ defined by the nomenclature (YXw)/φ of the IEEE Std-176 (1949 revision) standard equal to zero and cut along a first cutting angle θ1 defined by the nomenclature (YXl)/θ of the IEEE Std-176 (1949 revision) standard, such that the electroacoustic coupling of the shear waves is greater than 5%, the transducer 6 having a temperature coefficient of the frequency CTFA as a function of the first cutting angle θ1.

The material of the transducer 6 is included in the group of materials made up of aluminum nitride (AlN), zinc oxide (ZnO), lithium niobate (LiNbO$_3$), lithium tantalate (LiTaO$_3$) and potassium niobate.

Preferably, a material among lithium niobate (LiNbO3) and lithium tantalate (LiTaO$_3$) will be chosen due to an easier mastery of the method for manufacturing a monocrystal with a significant thickness.

Lithium niobate and tantalate can be manufactured by wafer with 4" diameter according to thickness standards of 500 μm and 350 μm.

In a second step 104, an acoustic substrate 10 is provided made up of a layer of a second thickness of a second material having a functional frequency acoustic quality coefficient product at least equal to 5·10$^{12}$, oriented along an angle φ defined by the nomenclature (YXw)/φ of the IEEE Std-176 (1949 revision) standard equal to zero, cut along a second cutting angle θ2 defined by the nomenclature (YXl)/θ of the IEEE Std-176 (1949 revision) standard, having at least one polarization direction $\vec{P}_{B1}$ corresponding to a shearing mode of vibration, the acoustic substrate 10 having a temperature coefficient of the frequency of the first order corresponding to the at least one shearing mode and depending on the second cutting angle θ2.

In step 104, the second cutting angle θ2 of the acoustic substrate 10 is such that the temperature coefficient of the first order CTFB1 corresponding to the at least one shear mode and the second cutting angle θ2, is zero with inversion of its sign on either side or equal to the opposite of the temperature coefficient of frequency CTFA of the transducer 6 weighted by an increasing function of the second thickness over the first thickness when the ratio is greater than or equal to 0.02.

The material of the acoustic substrate is included in the group of materials made up of quartz and isomorphous substitutes for example of the GeO$_2$ and TeO$_2$ type, gallium orthophosphate (GaPO$_4$) also with an isomorphous structure, potassium niobate, lithium tetraborate (LiB4O$_7$), langasite (La$_3$Ga$_5$SiO$_{14}$), langatate, langanite and their different variations.

Preferably, the material of the acoustic substrate is quartz due to its remarkable temperature stability properties and its complete knowledge in the crystallography field.

In a following step 106, one face of the transducer 6 and one face of the acoustic substrate 10 are metalized according to a thickness between 100 to 200 nm by a thermo-compressible or cold compressible material, for example gold, copper or indium, in order to adhere the two faces and thereby form a counter-electrode.

Gold is a particularly good material for this type of adhesion, given its plastic properties and its mechanical robustness sufficient to ensure an acoustic connection between the transducer 6 and the acoustic substrate 10.

In assembly step 108, the transducer 6 and the acoustic substrate 10 are arranged such that the polarization direction $\vec{P}_A$ of the shearing mode of the transducer 6 corresponding to the first cutting angle θ1 and the polarization direction $\vec{P}_{B1}$ of the at least one shearing mode of the substrate 10 corresponding to the second cutting angle θ2 are aligned.

In a following step 110, the adhesion is done by compression with or without temperature elevation depending on the metal used.

In the case where gold is used, the heating phase is eliminated and a long-lasting pressing is implemented to the benefit of the facing surface qualities and the ductility of the metal material to ensure the adhesion.

Thus, several lithium niobate/quartz composite slices were able to be produced in this way without flaws by simply keeping a temperature of 30° C. during the 16 hours of application of a pressure of 3000 Newtons.

Next in step 112, the slice of the resonator is burned in and polished.

Then in step 114, an electrode is metalized, e.g. by aluminum, on a face of the transducer 6 opposite the substrate.

The method is easy to implement and makes it possible to obtain good temperature stability performance.

Moreover, the resonators obtained using this method can operate up to frequencies of 20 GHz. The resonators are light and not bulky, and offer a high level of integration.

Such a resonator can for example be integrated into a homodyne oscillator or in cells of a high reject filter.

Of course, other applications can be considered.

The invention claimed is:

1. A resonator of the high bulk acoustic resonator type for operating at a predetermined working frequency, comprising:
    a piezoelectric transducer (6) formed by a layer with a first thickness of a first material oriented along an angle φ defined by the nomenclature (YXw)/φ of the IEEE Std-176 (1949 revision) standard equal to zero, cut along a first cutting angle θ1 defined by the nomenclature (YXl)/θ of the IEEE Std-176 (1949 revision) standard, such that the electroacoustic coupling of the shear waves for that material alone is greater than 5%, the transducer having a temperature coefficient of the frequency of the first order CTFA as a function of the first cutting angle θ1,
    an acoustic substrate (10) formed by a second layer with a second thickness of a second material having a functional frequency acoustic quality coefficient product at least equal to $5 \cdot 10^{12}$, oriented along an angle φ defined by the nomenclature (YXw)/φ of the IEEE Std-176 (1949 revision) standard equal to zero, cut along a second cutting angle θ2 defined by the nomenclature (YXl)/θ of the IEEE Std-176 (1949 revision) standard, having at least one polarization direction $\vec{P}_{B1}$ corresponding to a shearing mode of vibration, the acoustic substrate (10) having a temperature coefficient of the frequency of the first order CTFB1 corresponding to the at least one shearing mode and depending on the second cutting angle θ2,
    a counter-electrode (8) formed by a layer of metal adhering to a first face of the transducer (6) and a face of the acoustic substrate (10), and
    an upper electrode (4) arranged on a second face of the transducer (6) facing away from the first face of the transducer (6) and the substrate (10),
    characterized in that
    the relative arrangement of the transducer (6) and the substrate (10) is such that the direction of polarization $\vec{P}_A$ of the shearing mode of the transducer (6) corresponding to the first cutting angle θ1 and the polarization direction $\vec{P}_{B1}$ of the at least one shearing mode of the substrate (10) corresponding to the second cutting angle θ2 are aligned, and
    the second cutting angle θ2 of the substrate (10) is such that the temperature coefficient of the frequency of the first order CTFB1 corresponding to the at least one shear mode and to the second cutting angle θ2 is zero with inversion of its sign on either side or equal to the opposite of the temperature coefficient of frequency CTFA of the transducer (6) weighted by an increasing function of the ratio of the second thickness over the first thickness when the ratio is greater than or equal to 0.02.

2. The HBAR resonator according to claim 1, characterized in that the temperature coefficient of the frequency of the second order corresponding to the second cutting angle θ2 for which the temperature coefficient of the frequency of the first order CTFB1 cancels itself out by changing signs is also zero.

3. The HBAR resonator according to claim 1, characterized in that when the ratio Re of the second thickness over the first thickness is greater than or equal to 0.02, the second cutting angle θ2 verifies a relationship of form:

$$\alpha \cdot Re + \beta \cdot \log(\gamma \cdot Re) = (\theta2 - \theta2nul) \cdot slope,$$

θ2nul being a second cutting angle value for which the temperature coefficient of the frequency of the first order CTFB1 cancels itself out and changes signs, slope being the slope of CTFB1 relative to θ2 taken in θ2nul, α, β and γ are constants depending on the materials making up the acoustic substrate (10) and the transducer (6).

4. The HBAR type resonator according to claim 1, characterized in that the material of the transducer is included in the group of materials made up of aluminum nitride (AlN), zinc oxide (ZnO), lithium niobate (LiNbO$_3$), lithium tantalate (LiTaO$_3$) and potassium niobate.

5. The HBAR type resonator according to claim 4, characterized in that the material of the transducer is preferably included in the group of materials made up of lithium niobate (LiNbO$_3$) and lithium tantalate (LiTaO$_3$).

6. The HBAR type resonator according to claim 1, characterized in that the material of the acoustic substrate is included in the group of materials made up of quartz, potassium niobate, gallium orthophosphate (GaPO$_4$), lithium tetraborate (LiB$_4$O$_7$), langasite (La$_3$Ga$_5$SiO$_{14}$), langatate and langanite.

7. The HBAR type resonator according to claim 6, characterized in that the material of the acoustic substrate is quartz.

8. The HBAR type resonator according to claim 1, characterized in that the counter-electrode is a thermo-compressible metal.

9. The HBAR type resonator according to claim 1, characterized in that the counter-electrode is made of gold or copper or indium.

10. The HBAR type resonator according to claim 1, characterized in that the geometric dimensions of the resonator are adapted for a resonance frequency of a frequency band included in the frequency range from 50 MHz to 20 GHz.

11. The HBAR resonator according to claim 1, characterized in that
    the acoustic substrate (10) has a polarization direction for which the temperature coefficient of the frequency CTFB1 cancels itself out with sign inversion on either side in two values θ2nul1 and θ2nul2, the first value θ2nul1 being associated with a slow shearing mode of vibration and the second value θ2nul2 being associated with a fast shearing mode of vibration.

12. The HBAR resonator according to claim 11, characterized in that the material of the acoustic substrate (10) is quartz.

13. The HBAR resonator according to claim 12, characterized in that the material of the transducer (6) is lithium niobate and in that:
    when θ2nul is equal to +35 degrees,
        α is equal to 0.85,
        β is equal to 3.2
        γ is equal to 200,
        and slope is equal to $5 \cdot 10^{-6}$,
    when θ2nul is equal to −42 degrees,
        α is equal to 1.25×50
        β is equal to 3.2
        γ is equal to 200,
        and slope is equal to $2.2 \cdot 10^{-6}$.

14. A method for manufacturing a HBAR resonator comprising the following steps:
    in a first step (102), providing a piezoelectric transducer (6) made up of a layer of a first thickness of a first material oriented along an angle φ defined by the nomenclature (YXw)/φ of the IEEE Std-176 (1949 revision) standard equal to zero and cut along a first cutting angle θ1 defined by the nomenclature (YXl)/θ of the IEEE Std-176 (1949 revision) standard, such that the electroacoustic coupling of the shear waves is greater than 5%, the transducer (6) having a temperature coefficient of the frequency CTFA as a function of the first cutting angle θ1, in a second step (104), providing an acoustic substrate (10) formed by a first layer with a second thickness of a second material having a functional frequency acoustic quality coefficient product at least equal to $5 \cdot 10^{12}$, oriented along an angle φ defined by the nomenclature (YXw)/φ of the IEEE Std-176 (1949 revision) standard equal to zero, cut along a second cutting angle θ2 defined by the nomenclature (YXl)/θ of the IEEE Std-176 (1949 revision) standard, having at least one polarization direction $\vec{P}_{B1}$ corresponding to a shearing mode of vibration, the acoustic substrate (10) having a temperature coefficient of the frequency of the first order corresponding to the at least one shearing mode and depending on the second cutting angle θ2, the second cutting angle θ2 of the acoustic substrate (10) being such that the temperature coefficient of the frequency of the first order CTFB1 corresponding to the at least one shearing mode and to the second cutting angle θ2 is zero with inversion of its sign on either side or equal to the opposite of the frequency temperature coefficient CTFA of the transducer (6) weighted by an increasing function of the ration of the second thickness over the first thickness when the ratio is greater than or equal to 0.02, and in an assembly step (108), arranging the transducer (6) and the acoustic substrate (10) such that the polarization direction $\vec{P}_A$ of the shearing mode of the transducer (6) corresponding to the first cutting angle θ1 and the polarization direction $\vec{P}_{B1}$ of the at least one shearing mode of the substrate (10) corresponding to the second cutting angle θ2 are aligned.

15. A homodyne oscillator comprising a HBAR resonator defined according to claim 1.

16. A high reject filter comprising HBAR resonator-based cells as defined in claim 1.

* * * * *